United States Patent
Scalise et al.

(10) Patent No.: US 6,785,861 B2
(45) Date of Patent: Aug. 31, 2004

(54) VERSATILE SERIAL CONCATENATED CONVOLUTIONAL CODES

(75) Inventors: Fabio Scalise, Milan (IT); Fabio Osnato, Milan (IT); Stefano Valle, San Donato Milanese (IT); Massimiliano Siti, San Donato Milanese (IT); Sergio Benedetto, Turin (IT)

(73) Assignee: STMicroelectronics S.r.l., Agrate Brianza (IT)

(*) Notice: Subject to any disclaimer, the term of this patent is extended or adjusted under 35 U.S.C. 154(b) by 373 days.

(21) Appl. No.: 09/781,130

(22) Filed: Feb. 9, 2001

(65) Prior Publication Data

US 2002/0138806 A1 Sep. 26, 2002

(51) Int. Cl.[7] ............................................. H03M 13/00
(52) U.S. Cl. ...................................... 714/786; 375/262
(58) Field of Search .............................. 714/786, 792; 375/262, 261, 265, 298, 308

(56) References Cited

U.S. PATENT DOCUMENTS

| 5,446,747 A | | 8/1995 | Berrou ........................ 714/788 |
| 6,023,783 A | * | 2/2000 | Divsalar et al. ............. 714/792 |
| 6,088,387 A | * | 7/2000 | Gelblum et al. ............. 375/222 |
| 6,594,318 B1 | * | 7/2003 | Sindhushayana ............. 375/262 |

OTHER PUBLICATIONS

Deng et al., High rate concatenated coding systems using bandwidth efficient trellis inner codes, May–1998, IEEE Trans. on comm., vol. 37, No. 5, p. 420–427.*
Eroz et al., On the design of prunable interleavers for Turbo Codes, 1999, IEEE, p. 1669–1673.*
Benedetto et al., A search for good convolutional codes to be used in the construction of Turbo codes, Sep.–1998, IEEE Trans. on Comm., vol. 46, No. 9, p. 1101–1105.*
Benedetto et al., Serial concatenation of interleaved codes: performance analysis, design, and iterative decoding, May–1998, IEEE Trans. on info. Theory, vol. 44, No. 3, p. 909–926.*
Robertson et al., Bandwidth–efficeint Turbo trellis–coded modulation using punctured component codes, Feb.–1998, IEEE journal on Selected Areas in Comm., vol. 16, No. 2, p. 206–218.*
Benedetto et al., A soft–input soft–output AAP module for iterative decoding of concatenated codes, Jan.–1997, IEEE Comm. letters, vol. 1, No. 1, p. 22–24.*
Goff et al., Turbo–codes and high spectral efficiency modulation, 1994, IEEE, p. 645–649.*
Berrou et al., Near shannon limit error–correcting coding and decoding: Turbo–codes (1), 1993, IEEE, p. 1064–1070.*
Viterbi, Andrew J. et al., "A Pragmatic Approach to Trellis–Coded Modulation," *IEEE Communications Magazine*, Jul. 1989, pp. 11–19.
Benedetto, S., et al., "Serial Concatenated Trellis Coded Modulation with Iterative Decoding: Design and Performance," *Proceedings of GLOBECOM '97–Communications Theory Miniconference*, Phoenix, AZ, Oct. 1997, pp. 38–43.
Benedetto, S., et al., "Soft–Input Soft–Output Modules for the Construction and Distributed Iterative Decoding of Code Networks ([1])," *European Transactions on Telecommunications*, vol. 9, Mar.–Apr. 1998, pp. 155–172.
Benedetto, S., et al., "Self–Concatenated Trellis Coded Modulation With Self–Iterative Decoding," *GLOBECOM '98–Communications Theory Miniconference*, Sydney, Australia, Oct. 1998.

\* cited by examiner

*Primary Examiner*—Albert Decady
*Assistant Examiner*—Shelly A. Chase
(74) *Attorney, Agent, or Firm*—Lisa K. Jorgenson; Robert Iannucci; Seed IP Law Group PLLC

(57) ABSTRACT

An input digital signal is encoded by subjecting it to a first convolutional coding step followed by an interleaving step and a second convolutional coding step. The serial concatenated convolutional coded signal thus obtained is then subjected to modulation by means of a two-dimensional modulation scheme such as M-PSK or M-QAM. The corresponding decoding process involves an iterative decoding algorithm based on cascaded logarithmic soft-input soft-output processing steps.

82 Claims, 3 Drawing Sheets

PRIOR ART

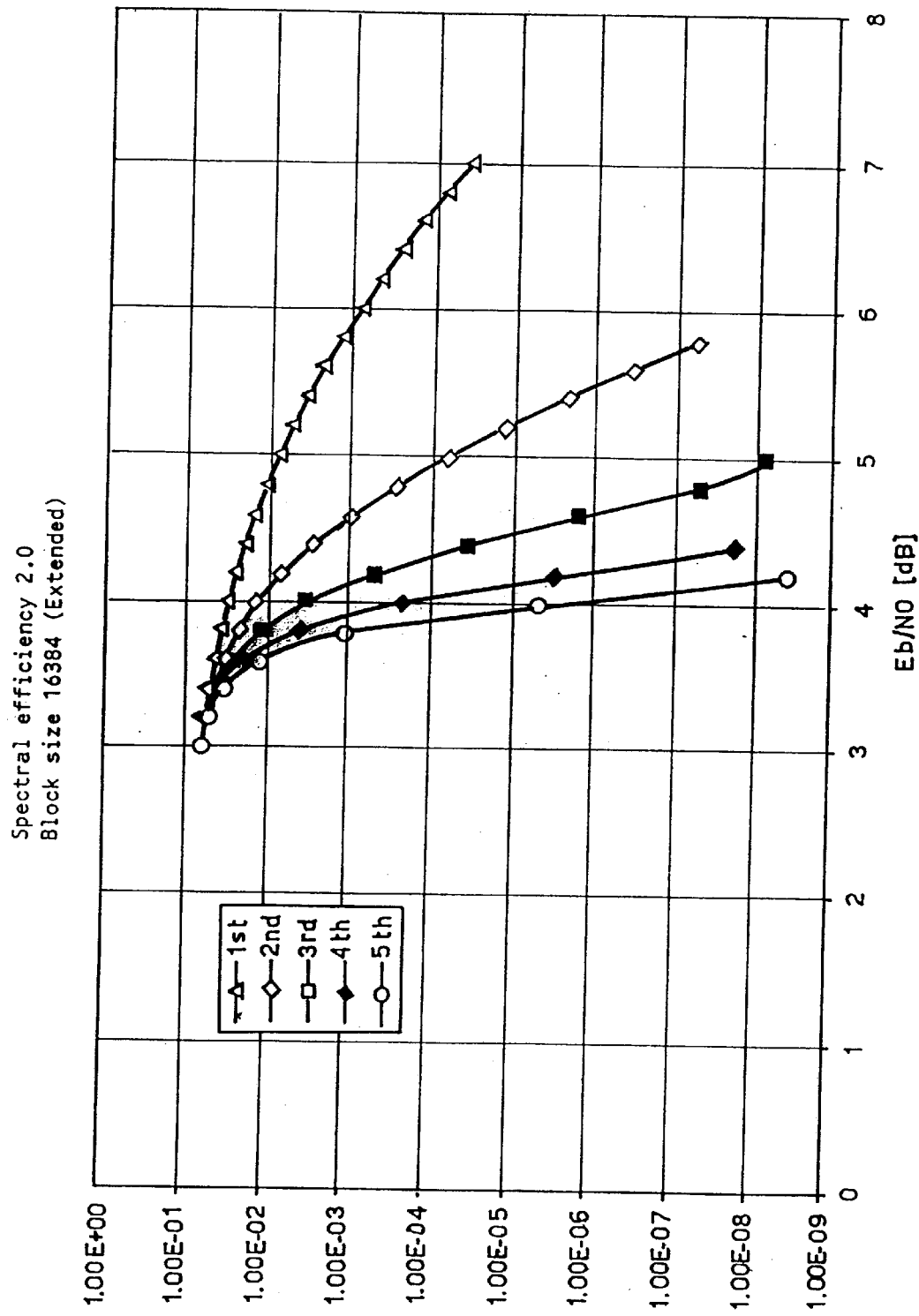

US 6,785,861 B2

VERSATILE SERIAL CONCATENATED CONVOLUTIONAL CODES

TECHNICAL FIELD

The present invention relates to modulation and encoding/decoding of signals. More specifically, the invention relates to a novel method and apparatus for obtaining flexible-rate/bandwidth-efficient encoding and decoding plus modulation.

BACKGROUND OF THE INVENTION

Several techniques for combining concatenated convolution codes with interleaver and spectrally efficient modulations have been proposed, due to the attractiveness of achieving high spectral efficiency and high coding gain at the same time.

Concatenated convolutional codes with interleaver (known as "turbo codes" in their parallel concatenated structure) represent one of the most important results in code theory achieved during the last decade; in fact, the performance of optimized schemes can be within 1 dB from the theoretical Shannon limit. The main ingredients of concatenated codes with interleaver consist of two Convolutional Codes (CCs) and one interleaver. The impressive performance of those codes is achieved through an iterative decoding process that refines the decisions taken by each constituent decoding block. Among the turbo codes two different classes can be distinguished depending on the concatenation scheme.

The first class is based on Parallel Concatenation: the information sequence enters the first systematic encoder, which generates a coded sequence; at the same time, the information sequence is transformed by the interleaver into a permutation of itself and is successively encoded by the second systematic encoder. A block diagram of the encoder in question is shown in FIG. 1. The code sequence of the parallel turbo code is obtained through concatenation, in some suitable order, of the two code sequences. This turbo code was first proposed in 1993 in C. Berrou, A. Glavieux and P. Thitimajshima, "Near Shannon Limit Error-Correcting Coding and Decoding: Turbo-Codes," in *Proceedings of ICC '93* (Geneva, Switzerland), pp. 1064–1070, May 1993, and further described in U.S. Pat. No. 5,446,747.

The second class is based on Serial Concatenation, as first proposed in S. Benedetto, D. Divsalar, G. Montorsi and F. Pollara, "Serial concatenation of interleaved codes: performance analysis, design and iterative decoding," *IEEE Transactions on Information Theory*, pp. 909–926, May 1998, which is incorporated herein by reference. In this case the output of the outer encoder is encoded by the inner encoder, after a permutation through a suitable interleaver. A block diagram of such an encoder is shown in FIG. 2.

The constituent codes (C1, C2) can be block or convolutional codes for both classes (parallel and serial).

Pragmatic Trellis-Coded Modulation (PTCM), proposed in the work by Andrew Viterbi, et al., "A Pragmatic Approach to Trellis-Coded Modulation," IEEE Communications Magazine, July 1989, pp. 11–19, is a combined error-correction coding and modulation scheme that utilizes a standard convolutional code applied to certain bits of M-ary Phase Shift Keyed (M-PSK) or M-ary Quadrature Amplitude Modulation (M-QAM) symbol mappings.

The earlier studies on concatenated codes with interleavers dealt with parallel concatenated convolutional codes (PCCC) with medium-low rates (½, ⅓ and below) used in conjunction with binary (or, equivalently, independent quaternary) modulations, such as 2-PAM, BPSK, QPSK, with the aim of obtaining very large coding gains. Subsequently, several attempts have been undertaken to merge PCCC with high-level modulation schemes in order to conjugate significant coding gains with high spectral efficiencies. The first paper on this subject is S. Le Goff, A. Glavieux and C. Berrou, "Turbo-codes and high spectral efficiency modulation," in *Communications, 1994. ICC '94, SUPERCOMM/ICC '94, Conference Record, "Serving Humanity Through Communications." IEEE International Conference on*, pp. 656–649 vol.2, 1994, which adopts a pragmatic approach to obtain 2,3 and 4 bits/signal by means of 8PSK and 16QAM modulations with turbo codes (PCCC schemes).

Several techniques to merge turbo codes with classical Ungerboeck Trellis-Coded Modulation (TCM) are described in the literature for both parallel and serial concatenated convolutional coding (SCCC) schemes.

Exemplary of the former coding schemes are the works by P. Robertson and T. Worz, "Bandwidth-efficient turbo trellis-coded modulation using punctured component codes," *IEEE Journal on Selected Areas in Communications*, vol. 16 2, pp. 206–218, February 1998, and S. Benedetto, D. Divsalar, G. Montorsi and F. Pollara, "Parallel concatenated trellis coded modulation," in *Proceedings of ICC '96*, (Dallas, Tex.), June 1996.

Exemplary of the latter coding schemes are the works S. Benedetto, D. Divsalar, G. Montorsi and F. Pollara, "Serial concatenated trellis coded modulation with iterative decoding: design and performance," in *Proceedings of GLOBECOM '97—Communications Theory Miniconference*, (Phoenix, Ariz.)., October 1997, and S. Benedetto, D. Divsalar, R. Garello, G. Montorsi and F. Pollara, "Self-Concatenated Trellis Coded Modulation with Self-Iterative Decoding," in *GLOBECOM '98—Communications Theory Miniconference*, (Sydney, Australia), October 1998.

Also, references of interest are U.S. Pat. No. 6,088,387 to Gelblum et al., and U.S. Pat. No. 6,023,783 to Divsalar et al.

Specifically, this latter patent discloses several improved turbo code apparatuses and methods encompassing several classes such as:

a data source is applied to two or more encoders with an interleaver between the source and each of the second and subsequent encoders. Each encoder outputs a code element which may be transmitted or stored. A parallel decoder provides the ability to decode the code elements to derive the original source information without the use of a received data signal corresponding to such information. The output may be coupled to a multilevel trellis-coded modulator (TCM);

a data source is applied to two or more encoders with an interleaver between the source and each of the second and subsequent encoders. Each of the encoders outputs a code element. In addition, the original data source is output from the decoder. All of the output elements are coupled to a TCM;

at least two data sources are applied to two or more encoders with an interleaver between each source and each of the second and subsequent encoders. The output may be coupled to a TCM;

at least two data sources are applied to two or more encoders with at least two interleavers between each source and each of the second and subsequent encoders; and at least one data source is applied to one or more serially linked encoders through at least one interleaver; the output may be coupled to a TCM.

Specifically, the solution described in the captioned patent includes a novel way of terminating a turbo coder.

SCCCs with interleavers have been shown to yield some advantages with respect to PCCCs, especially when very low bit error probabilities are being pursued: see in that respect the first work by Benedetto et al. referred to in the foregoing.

Besides, the need of combining large coding gains with high spectral efficiency is becoming increasingly important, owing to applications for which both power and bandwidth are precious and scarce resources. Moreover, applications in which the channel reliability is subject to large variations ask for coding-modulation schemes able to move back and forth the trade-off point between bandwidth and power efficiency in favor of either resource. In other words, rather than precisely tuned designs, those applications require versatile schemes yielding good, though not optimized, performance. For example, this is the case of wireless communications, like third generation cellular communications and digital video broadcasting.

SUMMARY OF THE INVENTION

Thus, the prior art fails to propose a "universal" encoding/decoding scheme that can yield the very good bit error rate performances of the SCCCs for a wide range of spectral efficiencies, and with the same hardware implementation.

An embodiment the present invention is thus to combine SCCC and two-dimensional modulation schemes (like M-PSK and M-QAM) to obtain a versatile structure for both encoder and decoder that yields the aforementioned advantages with respect to the solutions so far presented in the literature.

The embodiment provides a flexible-rate scheme yielding theoretical performance, in terms of coding gain, very close to the best bandwidth-efficient "ad hoc" optimized schemes, based on SCCC and classical TCM, presented in literature so far.

The embodiment further provides a set of rules for choosing the constituent convolutional codes, the structure of their interleaver, their puncturing rates and algorithms, the mapping to the two-dimensional modulator and the decoder architecture as well, so that a single encoder/decoder pair can be utilized on the basis of the desired spectral efficiency range.

The embodiment employs a serially concatenated convolutional code (SCCC) in conjunction with two-dimensional modulation schemes in a way different from the classical TCM schemes.

An innovative feature of the embodiment is its flexibility and versatility, as a high and versatile spectral efficiency can be achieved acting on a small set of parameters and employing the same architectural framework.

Irrespective of this, the performance does not present a significant degradation with respect to schemes optimized "ad hoc" for a given spectral efficiency. Moreover, the SCCC proposed implementation contains itself original ideas regarding some parts of the architecture, aimed at ensuring the above-mentioned flexibility of the scheme.

For the same reason, rather than a specific implementation of a digital transmission scheme including an error correcting code, a modulator and the receiving counterpart, the present embodiment primarily relates to original apparatus, and related set of design rules for its basic blocks, allowing to achieve the aforementioned advantages and goals.

BRIEF DESCRIPTION OF THE DRAWINGS

The invention will now be described, by way of example only, with reference to the annexed figures of drawing, wherein:

FIG. 5 is a Bit Error Rate (BER) v. Noise Level (Eb/N0) diagram representative of the performance of the invention.

DETAILED DESCRIPTION OF THE INVENTION

Figure 1:
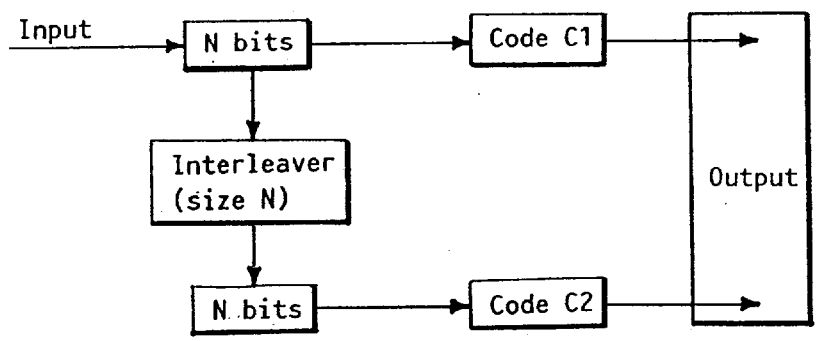
FIGS. 1 and 2, which are exemplary of the prior art, have been discussed in the foregoing.
Figure 2:
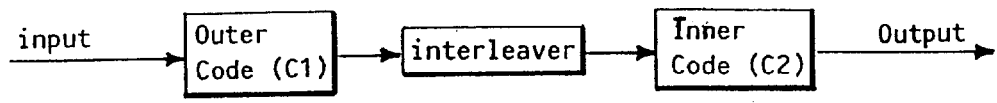
Figure 3:
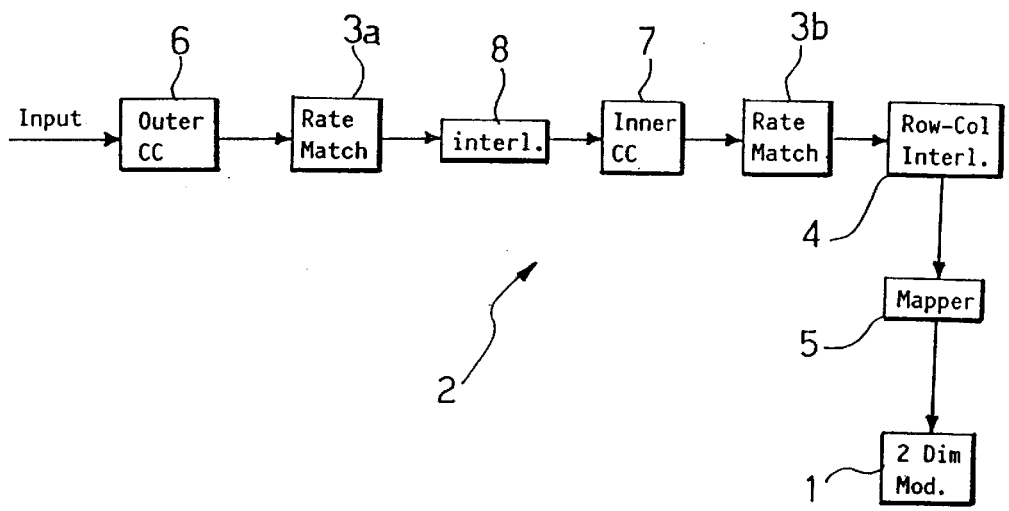
FIG. 3 is a block diagram showing the typical arrangement of a transmitter according to the invention.

A block diagram of a transmitter scheme based on SCCC is shown in FIG. 3.

Apart from a standard two-dimensional modulator 1, four main constituent functional blocks can be distinguished: an SCCC encoder, indicated 2 overall, two rate-matching modules 3a and 3b, a pre-mapping interleaver 4 (here implemented as a row-column interleaver), and a mapper 5.

The SCCC encoder 2 consists of the cascade of two convolutional codes (CC), designated 6 and 7, respectively, separated by an interleaver 8.

The two rate-matching blocks 3a and 3b are arranged one after each convolutional encoder 6, 7 and perform the puncturing of the respective encoder output, that is determining what encoded bits will not be transmitted, in order to match the required code rate. The feature of versatility is simply achieved through a controlled (i.e., by means of a properly designed algorithm) puncturing of the words coded by the standard convolutional constituent codes.

The pre-mapping interleaver 4 together with the mapper 5 determines the association of the encoded bits to the M channel symbols (e.g., M=8 for 8-PSK) available in the modulator 1.

The blocks portrayed in FIG. 3 will now be described in greater detail.

SCCC Encoder

The outer and inner encoders (designated 6 and 7, respectively) of the SCCC are systematic, recursive convolutional codes, of generic rate $r'_o$ and $r'_i$ (before puncturing); their generating matrices can be properly chosen, for instance according to the tables of best binary codes for turbo-code structure presented in S. Benedetto, R. Garello and G. Montorsi, "A search for good convolutional codes to be used in the construction of turbo codes," *IEEE Transactions on Communications*, vol. 46, pp. 1101–1105, September 1998, which is incorporated herein by reference.

As usual for most applications, the convolutional binary encoders are equivalent block encoders, obtained by appending to the information bits suitable bits to terminate both encoder trellises. Thanks to a proper and simple puncturing algorithm, namely a rate-matching algorithm, a coding scheme is obtained which is flexible and capable of coping with different spectral efficiencies. In fact, if $r_o$ and $r_i$ are the outer and inner code rates after puncturing, respectively, then the overall SCCC rate is $r_c = r_o r_i$. The modulation efficiency for M-PSK, M-QAM modulation is $\log_2(M)$ bits/signal; this means that the spectral efficiency r, defined as the number of information bits per modulated signal, is given by $r =_2(M)r_c$. It is clear that a wide range of spectral efficiencies $\log_2(M)r'_o r'_i \leq r \leq \log_2(M)$ can be achieved, where the lowest efficiency is obtained from the product of the rates of the two unpunctured convolutional codes.

Rate-Matching

The main design issues involved in the optimization of the rate-matching blocks 3a and 3b are:
- the choice of the best puncturing algorithm;
- the choice of the proper set of output bits (from each encoder) to be punctured;
- the choice of the optimum rate splitting between the outer and inner encoders for a given spectral efficiency.

For each convolutional code, given an equivalent block at the input of the encoder, the "puncturing ratio" p is defined as the ratio between the number of punctured bits and the size of the (unpunctured) output block. The versatility feature in the arrangement of the invention does not permit the puncturing patterns to be adapted to a particular rate. Different puncturing algorithms can be implemented, provided that they respect the above condition. For instance, a possibility is to use a very simple rate-matching algorithm, based only on the puncturing ratio: puncture the i-th coded bit if the following condition is verified: $(i-1)p < \lceil ip \rceil$. As a result, a uniform puncturing pattern is obtained. The algorithm can be easily implemented, and only relies on the knowledge of the puncturing ratio p, directly related to the desired spectral efficiency. As a consequence, a table containing the set of the desired spectral efficiencies and the corresponding puncturing ratios can be embedded in the transmitter hardware to feed the rate-matching algorithm. Both the two rate-matching blocks 3a, 3b operate according to such an algorithm.

An important design issue is the decision about the coded bits to be punctured in order to reach the desired SCCC rate: the two immediate alternatives are to apply the rate-matching algorithm to all coded bits, or rather to limit it to the parity check ones only, leaving untouched the systematic bits. It has been proven (see again the first work by Benedetto et al. referred to in the foregoing) that in order to obtain the best performance of the SCCC in terms of bit error probability, the parameters to be maximized are the free distance of the outer coder ($d_o$) and the effective free distance of the inner coder ($d_{i,eff}$, defined as the minimum Hamming weight of code words generated by weight-2 information words). Therefore a proposed design criterion, certainly not exhaustive of the matter, is to compute $d_o$ and its multiplicity versus the code rate $r_o$ in the range $r'_o \leq r_o \leq 1$, corresponding to the full range of spectral efficiencies, and to do the same for $d_{i,eff}$ and its multiplicity versus $r_i$. The best set of output bits to be punctured is the one that yields the highest minimum free distance for the largest puncturing range.

Also, it must be considered that the same overall SCCC rate $r_c$ can be obtained with a variable split of the outer and inner rate: in particular, the outer code rate is given by $r_o = (r_c)^\gamma$ whereas the inner code rate is $r_i = (r_c)^{1-\gamma}$. The parameter $\gamma$ controls the rate splitting, and is subject to optimization. Different design criteria are possible. Based on the performance analysis described in the work by Benedetto et al. repeatedly captioned in the foregoing, the following proposal can be made: for a given overall SCCC rate $r_c$, the highest outer code rate is used which yields the same free distance obtained with the minimum rate, i.e., $r_o = r_c$, obtainable with inner rate 1. This represents a good compromise between the two contrasting requirements of maximizing the outer code free distance and the inner code effective free distance, privileging the first one, to which is related the so-called "interleaver gain."

In this way, the values of the desired spectral efficiencies and the outer and inner "optimized" rates can be stored in a table to be passed to the rate-matching algorithms automatically.

The Code Interleaver

An interleaver transforms a sequence of bit (or symbols) into another sequence of the same bits (symbols) with a different order. The code interleaver block 8 of FIG. 3 receives the sequence coded by the first CC and possibly punctured by the first rate-matching block 3a. The main role of this block is to make the errors possibly produced during the decoding phase by the inner decoder (see below for the description of the decoding procedure) independent of one another. The specific interleaver output order depends on the adopted law; some different choices can be made, taking into account that the final goal is to randomize the input sequence. The present illustrative and non-exhaustive implementation is based on a random permutation of the input order that guarantees a certain minimum distance between two neighboring bits in the input sequence. The code interleaver size depends on the chosen outer code rate; hence, in principle, a number of interleaving laws equal to the number of spectral efficiencies chosen for a given application are to be provided and then stored someway in the hardware implementation. An alternative and more versatile approach, is to prune (i.e. to exclude the oversized positions) an interleaver law built for the largest required size corresponding to the minimum outer code rate; the interleaver pruning technique has been disclosed M. Eroz et al., "On the design of prunable interleavers for turbo codes," 1999 *IEEE 49th Vehicular Technology Conference*, Vol. 2, pp. 1669–1673, 1999, which is incorporated herein by reference.

The Pre-Mapping Interleaver

The aim of the pre-mapping interleaver 4 that follows the rate-matching block of the inner encoder is to spread as much as possible, after de-interleaving, the bits associated to the same channel symbol. In the presently preferred embodiment of the invention, this is implemented as a row-column interleaver; in this case the number of rows becomes $\log_2$ (M). As a consequence, the number of rows becomes $N_{out}/\log_2(M)$, $N_{out}$ being the number of output bits (survived after puncturing) of an output block of the SCCC. The bits output by the inner rate-matching block are written column wise into the interleaver. The bits in every row of the interleaver will identify a modulator signal.

The Mapper

The mapper 5 determines the one-to-one association of the $\log_2 M$ (for an M-ary modulation) encoded bits in each row of the interleaver 4 to the M channel symbols available in the modulator 1. The choice of the mapping, i.e., of the ordering of the bits within the $\log_2 M$ defining the signal, is subject to optimization. The presently preferred solution is to employ the well-known Gray mapping, with the most protected bit associated to the systematic bits. A standard two-dimensional modulator 1 is then employed.

The Receiver

Typical turbo decoders can be based on a Maximum-Likelihood (ML) approach, such as the soft output Viterbi algorithm (SOVA) as described in H. Hagenauer, P. Hoeher, "A Viterbi algorithm with soft-decision outputs and its applications," 1989 *IEEE Globecom Conference*, pp. 1680–1686, or on a Maximum A-Posteriori Probability (MAP) one, such as described in L. R. Bahl, J. Cocke et al., "Optimal decoding of linear codes for minimizing symbol error rate," *IEEE Transactions on Information Theory*, pp. 284–287, March 1974, both of which are incorporated herein by reference. The MAP approach is to be preferred because of its superior performance.

Figure 4:
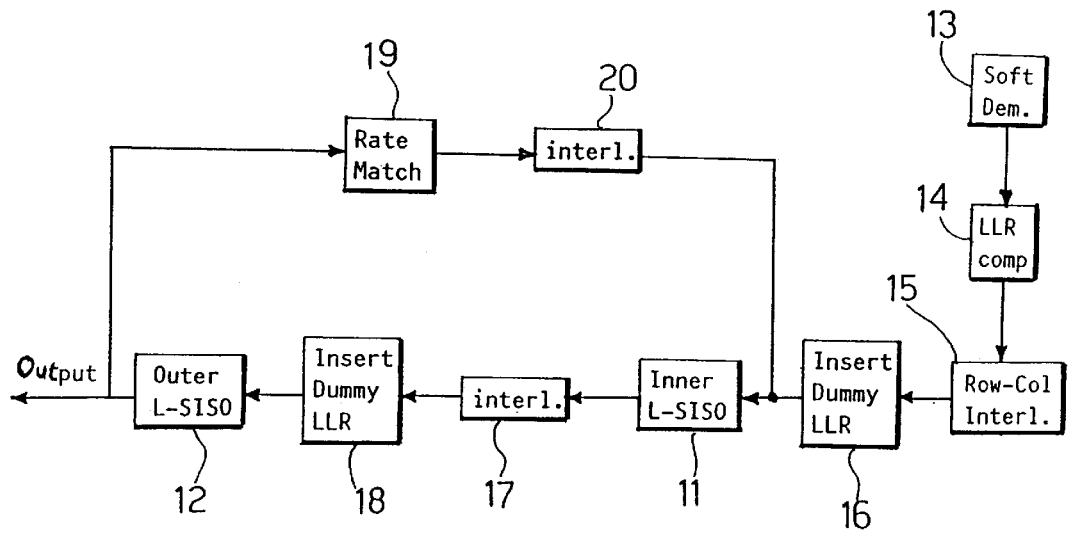
FIG. 4 is another block diagram showing the typical arrangement of a receiver according to the invention.

A block diagram of a serial decoder structure in accordance with the present invention is shown in FIG. 4, and is based on the iterative decoding algorithm for SCCCs conceptually described in the work by Benedetto et al. repeatedly referred to in the foregoing.

The core of the decoding procedure consists of the two blocks called inner decoder and outer decoder designated 11 and 12, respectively, in the diagram of FIG. 4. They are binary probabilistic decoders matched to the two constituent encoders. In the presently preferred embodiment of the invention they can be based on the L-SISO (Logarithmic Soft-Input Soft-Output) module proposed in S. Benedetto, D. Divsalar, and F. Pollara, "A soft-input soft-output APP module for iterative decoding of concatenated codes," *IEEE Communications Letters*, Vol. 1, no. 1, pp. 22–24, January 1997, incorporated herein by reference, that implements a slight generalization of the BCJR algorithm disclosed in the work by Bahl et al. cited in the foregoing. They perform the A-Posteriori Probability computation in the logarithmic domain and are used a number of times that depend on the iterations performed. A detailed explanation of the operations performed by the inner and outer decoders 11 and 12 is provided in S. Benedetto, D. Divsalar, G. Montorsi, and F. Pollara, "Soft-input soft-output modules for the construction and distributed iterative decoding of code networks," *European Transactions on Telecommunications*, Vol. 9, pp. 155–172, March 1998, which is incorporated herein by reference.

At the input side of the receiving chain, the received signal enters first a soft demodulator 13, which extracts the real and imaginary parts. Subsequently, the block 14 labeled as "LLR Comp," performs the Log-likelihood ratio computations of the coded bits associated to the received signal. To compute the LLR of the bits, first the log-likelihood values of all modulation signals $s_i$ are evaluated according to:

$$L_i = \exp\left(-\frac{\|r - s_i\|^2}{N_0}\right)$$

where r is the received signal and $N_0$ is proportional to the noise variance. Then, the LLRs of the individual bits are computed as follows:

$$\lambda_k = \log\left(\sum_{i:b_k(s_i)=1} L_i\right) - \log\left(\sum_{i:b_k(s_i)=0} L_i\right)$$

where $b_k(.)$ are the mapping functions that associated to the i-th modulation signal the value of the k-th bit of its label. Specifically, as an example, the LLRs of the individual bits, as mapped on an 8-PSK constellation with the Gray mapping, are:

$\lambda_2 = \log(L_4+L_5+L_6+L_7) - \log(L_0+L_1+L_2+L_3)$ $\lambda_1 = \log(L_2+L_3+L_4+L_5) - \log(L_0+L_1+L_6+L_7)$ $\lambda_0 = \log(L_1+L_2+L_5+L_6) - \log(L_0+L_3+L_4+L_7)$ A row-column interleaver designated 15 performs the inverse operation with respect to the transmitting side, i.e., the LLRs are written row wise and read column wise. The missed LLRs, corresponding to the bits punctured by the inner rate-matching block, are replaced with dummy LLRs by a block 16 labeled "Insert dummy LLR," which therefore performs the "depuncturing" operation. The LLRs sequence then feeds the inner L-SISO block 11. The new LLRs out of the inner L-SISO block 11 are de-interleaved in 17 and the missed LLRs are replaced by a second "Insert dummy LLR" block 18 in the same way as those coming directly from the row-column interleaver. The resulting LLRs feed the outer L-SISO 18. The LLRs out of the outer L-SISO can be used in two ways.

Firstly, they are used to feed the inner L-SISO 11 in order to improve its LLRs calculation according to the iterative process typical of turbo codes decoding.

In this case, the LLRs first undergo the same rate-matching and interleaving as in the coding step out of the outer CC in order to be consistent with the LLRs coming from the demodulator. This is portrayed in the scheme of FIG. 4 by a rate matching block 19 followed by an interleaver 20.

Otherwise, after a proper number of iterations, the resulting LLRs are used to make the definitive decision on the received bits. The number of iterations depends on the required performance of the entire system and some stop criteria can be easily implemented; a trivial solution is to fix a priori the number of iterations.

From the point of view of the hardware implementation, the iterative process principle does not exclude the use of a pipelined architecture, instead of a feedback approach; in this case each iteration is performed by a decoding block comprehensive of two L-SISO blocks 11 and 12 connected as just described; the single iteration blocks are sequentially connected to each other through the rate-matching block of the outer encoder 19 and the SCCC interleaver 20. This solution could be the unique feasible implementation in case of extremely high data throughput. Of course, in this case the maximum number of iterations is limited by the number of implemented blocks.

The described structure yields a great flexibility to the system; in fact, using a single decoder module, a large range of bandwidth efficiencies can be obtained by simply varying the modulation scheme, the puncturing ratios, and the LLR computation.

As an example in FIG. 5 the Bit Error Rate curve is shown related to a SCCC implemented according to the present invention scheme in conjunction with 8-PSK modulation. The constituent encoders are systematic, recursive, rate 2/3 convolutional codes chosen from the tables in S. Benedetto, R. Garello and G. Montorsi, "A search for good convolutional codes to be used in the construction of turbo code," *IEEE Transactions on Communications*, vol. 46, pp. 1101–1105, September 1998, which is incorporated herein by reference. The outer code has 8 states, the inner 4. The range of spectral efficiencies is $4/3 \leq r \leq 3$ bit/s/Hz and it is obtained through the rate-matching block. The SCCC interleaver is an S-random interleaver with spread factor 49. The curves are related to the first 5 iterations. The rate splitting is optimized through the aforesaid method.

It will be understood that the specific forms of the invention herein illustrated and described are intended to be representative only, as certain changes may be made therein without departing from the clear teachings of the disclosure. Accordingly, reference should be made to the following appended claims in determining the full scope of the invention.

What is claimed is:

1. A method of encoding an input digital signal, comprising:
    subjecting said input digital signal to a cascade of a first convolutional coding step, an interleaving step and a second convolutional coding step to generate a serial concatenated convolutional coded signal; and
    modulating said serial concatenated convolutional coded signal by a two-dimensional modulation scheme, wherein at least one of said first and second convolutional coding steps generates a respective convolutional coded signal to be transmitted with a required code rate and further including at least one rate-matching step implemented by puncturing said respective convolutional coded signal by determining what symbols of said respective convolutional coded signal are to be transmitted in order to match said required code rate.

2. The method of claim 1 wherein said two-dimensional modulation scheme is selected from a group consisting of M-PSK and M-QAM.

3. The method of claim 1 wherein said modulating step involves associating symbols of said serial concatenated convolutional coded signal to channel symbols.

4. The method of claim 3 wherein the number of said channel symbols is eight.

5. The method of claim 3 wherein said modulation step includes the steps of subjecting said serial concatenated convolutional coded signal to pre-mapping interleaving to generate a pre-mapping interleaved signal and mapping said pre-mapping interleaved signal to associate it with said channel symbols.

6. The method of claim 5, including the steps of performing said mapping step in an optimized manner by means of Gray mapping.

7. The method of claim 6 wherein said Gray mapping involves associating the most protected bit to the systematic bits.

8. The method of claim 1 wherein at least one of said first and second convolutional coding steps is based on systematic, recursive convolutional coding at a respective code rate.

9. The method of claim 1 wherein at least one of said first and second convolutional coding steps involves the use of a respective generating matrix corresponding to binary codes for turbo-code structures.

10. The method of claim 1 wherein at least one of said first and second convolutional coding steps involves block encoding based on a respective encoder trellis, wherein said block encoding appends terminating bits to terminate said respective encoder trellis.

11. The method of claim 1 wherein said puncturing step is performed on the basis of a puncturing ratio defined as the ratio between a number of punctured symbols and a size of an unpunctured output block and wherein an i-th symbol respective convolutional coded signal is punctured if the condition $(i-1)p < \lceil ip \rceil$ is verified, wherein p is said puncturing ratio.

12. The method of claim 1 wherein said puncturing step is performed on the basis of a puncturing ratio and includes the step of selecting said puncturing ratio as a function of a desired spectral efficiency and further including the step of storing a set of desired spectral efficiencies and the corresponding puncturing ratios.

13. The method of claim 1 wherein said rate-matching by puncturing is applied to all symbols in said respective convolutional coded signal.

14. The method of claim 1 wherein said respective convolutional coded signal includes parity check bits and said rate-matching by puncturing is performed on said parity check bits only.

15. The method of claim 1 wherein said rate-matching by puncturing involves the steps of:
computing a first free distance of said first convolutional coding step and its multiplicity versus a code rate of said first convolutional coding step corresponding to a full range of spectral efficiencies;
computing a second effective free distance of said second convolutional coding step as a minimum Hamming weight of code words generated by weight-2 information words and a multiplicity of the minimum Hamming weight versus a code rate of said second convolutional coding step; and
identifying a set of output symbols to be punctured as one yielding the highest minimum free distance for the largest puncturing range.

16. The method of claim 1 wherein the first convolutional coding step generates a first convolutional coded signal and the second convolutional coding step generates a second convolutional coded signal, the method further comprising the step of subjecting said second convolutional coded signal to said rate-matching by puncturing and an interleaving step by writing said first convolutional coded signal subjected to said puncturing by writing systematic bits first and then unpunctured parity-check bits.

17. The method of claim 1 wherein said interleaving step is based on a random permutation of an order of symbols of said input signal subject to said first convolutional coding step to guarantee a minimum distance between two neighboring symbols in said input digital signal.

18. The method of claim 1, further comprising the steps of choosing a number of spectral efficiencies for said coding and storing a corresponding number of interleaving laws.

19. The method of claim 1, further comprising the steps of defining a minimum outer code rate for said interleaving step, defining an interleaving law for a largest required code size corresponding to said minimum outer code rate, said interleaving law including oversize positions, and subsequently pruning said interleaver law to exclude said oversize positions.

20. The method of claim 1 wherein said modulating step involves subjecting said serial concatenated convolutional code to row-column interleaving over a selected number of columns.

21. The method of claim 20 wherein said number of columns is selected equal to three.

22. A method of encoding an input digital signal, comprising:
subjecting said input digital signal to a cascade of a first convolutional coding step, an interleaving step and a second convolutional coding step to generate a serial concatenated convolutional coded signal;
modulating said serial concatenated convolutional coded signal by a two-dimensional modulation scheme;
generating, by said first convolutional coding step, an outer code having an outer code rate;
generating, by means of said second convolutional coding step, an inner code having an inner code rate;
selecting said outer code rate as $r_o = (r_c)^\gamma$; and
selecting said inner code rate as $r_i = (r_c)^{1-\gamma}$;
where $r_c$ is the product of said inner and outer rates and $\gamma$ is an optimized rate splitting parameter.

23. The method of claim 22 wherein said optimized rate splitting parameter is selected as the one which, for a given said product gives the highest outer code rate yielding the same free distance obtained with a minimum rate obtainable by selecting said inner rate as equal to unity, whereby $r_o = r_c$.

24. The method of claim 22 wherein at least one of said first and second convolutional coding steps generates a respective convolutional coded signal to be transmitted with a required code rate and Further including at least one rate-matching step implemented by subjecting said respective convolutional coded signal to puncturing to determine what symbols of said respective convolutional coded signal are to be transmitted in order to match said required code rate, further including the step of passing automatically said selected outer and inner rates to a rate-matching puncturing function that performs the rate-matching step.

25. A method of decoding a serial concatenated convolutional coded signal modulated by means of a two-dimensional modulation scheme, the method comprising:

subjecting said coded signal to a cascade of a first decoding step, an interleaving step and a second decoding step; and subjecting said coded signal to a log-likelihood ratio computation of coded symbols associated with said coded signal, wherein said coded signal is subjected to row-column interleaving before being modulated by means of said two-dimensional modulation schemes, wherein decoding said coded signal involves the step of subjecting said coded signal to a complementary row-column interleaving function and wherein said log-likelihood ratios are written row wise and read column wise.

26. The method of claim 25 wherein the first decoding step includes a first logarithmic soft-input soft-output processing function and the second decoding step includes a second logarithmic soft-input soft-output processing step.

27. The method of claim 25 wherein said serial concatenated convolutional coded signal is generated by cascaded first and second convolutional coding steps and said first and second decoding steps are matched to said first and second convolutional coding steps, respectively.

28. The method of claim 25 wherein said first and second decoding steps perform an a-posteriori probability computation in the logarithmic domain.

29. The method of claim 25, wherein said first and second decoding steps are used in an iterative manner.

30. The method of claim 25, including the steps of subjecting said coded signal to a soft demodulating function to extract real and imaginary parts thereof prior to subjecting said coded signal to said first and second decoding steps.

31. The method of claim 30, including the steps of subjecting said coded signal to a log-likelihood ratio computation of the coded symbols associated to said signals and wherein said log-likelihood ratio computation is performed on said coded signal after soft de-modulation.

32. The method of claim 25 wherein the log-likelihood ratios out of said second decoding step are fed to said first decoding step to improve the log-likelihood ratio computation performed therein according to an iterative process.

33. The method of claim 25 wherein log-likelihood produced by said log-likelihood ratio computation are used to make definite decisions on the coded symbols.

34. The method of claim 33 wherein said definite decisions on the coded symbols are made after a given number of iterations.

35. The method of claim 34, including the step of fixing a priori the number of said iterations.

36. A method of decoding a serial concatenated convolutional coded signal modulated by means of a two-dimensional modulation scheme, the method comprising:

subjecting said coded signal to a cascade of a first decoding step, an interleaving step and a second decoding step; and subjecting said coded signal to a log-likelihood ratio computation of coded symbols associated with said coded signal, wherein said log-likelihood ratio computation include the steps of:

evaluating log-likelihood values of all modulation signal, said signals being designated $s_i$, according to the relationship:

$$L_i = \exp\left(-\frac{\|r - s_i\|^2}{N_0}\right)$$

where r is the received signal and $N_0$ is a factor proportional to the noise variance, and subsequently computing the log-likelihood ratios of the individual symbols as follows:

$$\lambda_k = \log\left(\sum_{i:b_k(s_i)=1} L_i\right) - \log\left(\sum_{i:b_k(s_i)=0} L_i\right)$$

where $b_k(.)$ are the mapping functions that associate to the i-th modulation signal the value of the k-th symbol of its label.

37. A method of decoding a serial concatenated convolutional coded signal modulated by means of a two-dimensional modulation scheme, the method comprising:

subjecting said coded signal to a cascade of a first decoding step, an interleaving step and a second decoding step; and subjecting said coded signal to a log-likelihood ratio computation of coded symbols associated with said coded signal, wherein said coded signal is generated by means of cascaded first and second convolutional coding steps, wherein at least one of said first and second convolutional coding steps generates a respective convolutional coded signal to be transmitted with a required code rate and further includes at least one rate-matching step implemented by subjecting said respective convolutional coded signal to puncturing to determine what symbols of said respective convolutional coded signal are to be transmitted in order to match said required code rate, whereby certain log-likelihood ratios are missing in said coded signal subject to said log-likelihood ratio computation, the decoding method further including the step of replacing the missing log-likelihood ratios by means of dummy log-likelihood ratios.

38. The method of claim 37, including the step of replacing the missing log-likelihood ratios by means of dummy log-likelihood ratios both before and after said first decoding step.

39. The method of claim 37 wherein coded signal is subjected to row-column interleaving before being modulated by means of said two-dimensional modulation scheme, wherein decoding said coded signal involves the step of subjecting said coded signal to a complementary row-column interleaving function.

40. A method of decoding a serial concatenated convolutional coded signal modulated by means of a two-dimensional modulation scheme, the method comprising:

subjecting said coded signal to a cascade of a first decoding step, an interleaving step and a second decoding step; and subjecting said coded signal to a log-likelihood ratio computation of coded symbols associated with said coded signal, wherein the log-likelihood ratios out of said second decoding step are fed to said first decoding step to improve the log-likelihood ratio computation performed therein according to an iterative process, wherein the serial concatenated convolutional coded signal was generated by means of cascaded first and second convolutional coding steps, wherein said first coding step generates a first convolutional coded signal to be transmitted with a required code rate and further includes at least one of:

a rate-matching step implemented by subjecting said respective convolutional coded signal to puncturing to determine what symbols of said first convolutional coded signal are to be transmitted in order to match said required code rate; and an interleaving step of said first convolutional coded signal, the decoding method involving the step of subjecting said log-likelihood ratios to at least one of a rate-matching function and an interleaving function matching said rate matching step and said interleaving step performed on said first convolutional coded signal, respectively.

41. An apparatus for encoding an input digital signal, comprising a cascade of a first convolutional coding module, an interleaving module and a second convolutional coding module to generate a serial concatenated convolutional coded signal; and a modulation module for subjecting said serial concatenated convolutional coded signal to modulation by means of a two-dimensional modulation scheme, wherein at least one of said first and second convolutional coding modules generates a respective convolutional coded signal to be transmitted with a required code rate and further including at least one rate-matching module for subjecting said respective convolutional coded signal to puncturing to determine what symbols of said respective convolutional coded signal are to be transmitted in order to match said required code rate.

42. The apparatus of claim 41 wherein said two-dimensional modulation scheme is selected from a group consisting of M-PSK and M-QAM.

43. The apparatus of claim 41 wherein said modulating module is configured to associate the symbols of said serial concatenated convolutional coded signal to channel symbols.

44. The apparatus of claim 43 wherein the number of said channel symbols is eight.

45. The apparatus of claim 43 wherein said modulation module includes an interleaver for subjecting said serial concatenated convolutional coded signal to pre-mapping interleaving to generate a pre-mapping interleaved signal and a mapping module for mapping said pre-mapping interleaved signal to associate it with said channel symbols.

46. The apparatus of claim 45 wherein said mapping module performs said mapping step in an optimized manner by means of Gray mapping.

47. The apparatus of claim 46 wherein said Gray mapping involves associating the most protected bit to the systematic bits.

48. The apparatus of claim 41 wherein at least one of said first and second convolutional coding modules is configured to perform systematic, recursive convolutional coding at at least one respective code rate.

49. The apparatus of claim 41 wherein at least one of said first and second convolutional coding modules involves a respective generating matrix corresponding to binary codes for turbo-code structures.

50. The apparatus of claim 41 wherein at least one of said first and second convolutional coding modules performs block encoding based on a respective encoder trellis, wherein said block encoding appends terminating bits to terminate said respective encoder trellis.

51. The apparatus of claim 41 wherein said at least one rate-matching module operates on the basis of a puncturing ratio defined as the ratio between the number of punctured symbols and the size of an unpunctured output block and wherein the i-th symbol respective convolutional coded signal is punctured if the condition $(i-1)p < \lceil ip \rceil$ is verified, wherein p is said puncturing ratio.

52. The apparatus of claim 41 wherein said at least one rate-matching module operates on the basis of a puncturing ratio selected as a function of a desired spectral efficiency and further includes a memory to store a set of desired spectral efficiencies and the corresponding puncturing ratios.

53. The apparatus of claim 41 wherein said rate-matching module applies puncturing to all the symbol in said respective convolutional coded signal.

54. The apparatus of claim 41 wherein said at least one of said first and second convolutional coding modules generate a respective convolutional coded signal involving parity check bits and said rate-matching module performs puncturing on said parity check bits only.

55. The apparatus of claim 41 wherein said rate-matching module performs puncturing by the steps of:

computing a first free distance of said first convolutional coding step and its multiplicity versus the code rate of said first convolutional coding step corresponding to a full range of spectral efficiencies;

computing a second effective free distance of said second convolutional coding step as the minimum Hamming weight of code words generated by weight-2 information works its multiplicity versus the code rate of said second convolutional coding step; and identifying a set of output symbols to be punctured as the one yielding the highest minimum free distance for the largest puncturing range.

56. The apparatus of claim 41, including said at least one rate-matching module for subjecting said second convolutional coded signal to said rate-matching by puncturing and said interleaving module for writing said first convolutional coded signal subjected to said puncturing by writing systematic bits first and then unpunctured parity-check bits.

57. The apparatus of claim 41, wherein said interleaving module realizes a random permutation of the order of the symbols of said input signal downstream of said first convolutional coding module to guarantee a minimum distance between two neighboring signals in said input digital signal.

58. The apparatus of claim 41, including a memory for storing a number of interleaving laws for said interleaving module said number of interleaving laws corresponding to a respective number of spectral efficiencies chosen for said coding.

59. The apparatus of claim 41 wherein said interleaving module defines a minimum output code rate for the respective interleaving step, an interleaving law for the largest required size corresponding to said minimum outer code rate, said interleaving law including oversize position, and subsequently prunes said interleaver law to exclude said oversize positions.

60. The apparatus of claim 41 wherein said modulating module subjects said serial concatenated convolutional code to row-column interleaving over a given number of columns.

61. The apparatus of claim 60 wherein said number of columns is equal to three.

62. An apparatus for encoding an input digital signal, comprising a cascade of a first convolutional coding module, an interleaving module and a second convolutional coding module to generate a serial concatenated convolutional coded signal; and a modulation module for subjecting said serial concatenated convolutional coded signal to modulation by means of a two-dimensional modulation scheme, wherein:

said first convolutional coding module generates an outer code having an outer code rate-selected as $r_0=(r_c)^\gamma$, said second convolutional coding module generates an inner code having an inner code rate-selected as $r_{i=(rc)}^{1-\gamma}$, wherein $r_c$ is the product of said inner and outer rates and $\gamma$ is an optimized rate splitting parameter.

63. The apparatus of claim 62 wherein said optimized rate splitting parameter is selected as the one which, for a given said product gives the highest outer code rate yielding the same free distance obtained with the minimum rate obtainable by selecting said inner rate as equal to unity, whereby $r_0=r_c$.

64. The apparatus of claim 62 wherein at least one of said first and second convolutional coding modules generates a respective convolutional coded signal to be transmitted with a required code rate and further includes at least one rate-matching module for subjecting said respective convolutional coded signal to puncturing to determine what symbols of said respective convolutional coded signal are to be transmitted in order to match said required code rate, wherein said selected outer and inner rates are passed automatically to said rate-matching module.

65. An apparatus for decoding a serial concatenated convolutional coded signal modulated by means of a two-dimensional modulation scheme, the apparatus comprising:

a cascade of a first decoding module, an interleaving module and a second decoding module, wherein the coded signal was subjected to row-column interleaving before being modulated by means of said two-dimensional modulation schemes;

a module for subjecting said coded signal to a log-likelihood ratio computation of coded symbols associated with said coded signal; and an interleaver for subjecting said coded signal to a complementary row-column interleaving function and wherein said log-likelihood ratios are written row wise and read column wise.

66. The apparatus of claim 65 wherein the first decoding module includes a first logarithmic soft-input soft-output processing module and the second decoding module includes a second logarithmic soft-input soft-output processing module.

67. The apparatus of claim 65 wherein said serial concatenated convolutional coded signal is generated by cascaded first and second convolutional coding steps and said first and second decoding modules are matched to said first and second convolutional coding steps, respectively.

68. The apparatus of claim 65 wherein said first and second decoding modules perform an a-posteriori probability computation in the logarithmic domain.

69. The apparatus of claim 65 wherein said first and second decoding modules operate in an iterative manner.

70. The apparatus of claim 65, including a soft demodulator for subjecting said modulated coded signal to a soft demodulating function to extract the real and imaginary parts thereof prior to feeding said coded signal to said first and second decoding modules.

71. The apparatus of claim 70 wherein said log-likelihood ratio computation is performed on said coded signal downstream of said soft demodulator.

72. The apparatus of claim 65 wherein the log-likelihood ratios out of said second decoding module are fed to said first decoding module to improve the log-likelihood ratio computation performed therein according to an iterative process.

73. The apparatus of claim 65 wherein the log-likelihood ratios out of said second decoding module are used to make definite decisions on the received symbols.

74. The apparatus of claim 73 wherein said definite decisions on symbols are made after a given number of iterations.

75. The apparatus of claim 74 wherein the number of said iterations is fixed a priori.

76. The apparatus of claim 65, for decoding a coded signal subjected to pre-mapping interleaving before being modulated by means of said two-dimensional modulation schemes, wherein said apparatus includes an interleaver for subjecting said coded signal to a complementary pre-mapping interleaving function.

77. An apparatus for decoding a serial concatenated convolutional coded signal modulated by means of a two-dimensional modulation scheme, the apparatus comprising:

a cascade of a first decoding module, an interleaving module and a second decoding module; and a module for subjecting said coded signal to a log-likelihood ratio computation of the coded symbols associated with said coded signal, wherein said log-likelihood ratio computation includes the steps of:

evaluating log-likelihood values of all modulation signal, said signals being designated $s_i$, according to the relationship:

$$L_i = \exp\left(-\frac{\|r - s_i\|^2}{N_0}\right)$$

where r is the received signal and $N_0$ is a factor proportional to the noise variance, and subsequently computing the log-likelihood ratios of the individual symbols as follows:

$$\lambda_k = \log\left(\sum_{i:b_k(s_i)=1} L_i\right) - \log\left(\sum_{i:b_k(s_i)=0} L_i\right)$$

where $b_k(.)$ are the mapping functions that associate to the i-th modulation signal the value of the k-th symbol of its label.

78. An apparatus for decoding a serial concatenated convolutional coded signal modulated by means of a two-dimensional modulation scheme, the apparatus comprising:

a cascade of a first decoding module, an interleaving module and a second decoding module;

a module for subjecting said coded signal to a log-likelihood ratio computation of the coded symbols associated with said coded signal, wherein the serial concatenated convolutional coded signal was generated by means of cascaded first and second convolutional coding steps, wherein at least one of said first and second convolutional coding steps generates a respective convolutional coded signal to be transmitted with a required code rate and further includes at least one rate-matching step implemented by subjecting said respective convolutional coded signal to puncturing to determine what symbols of said respective convolutional coded signal are to be transmitted in order to match said required code rate, whereby certain log-likelihood ratios are missing in said coded signal subject to said log-likelihood ratio computation; and an inserter module for replacing the missing log-likelihood ratios by means of dummy log-likelihood ratios.

79. The apparatus of claim 78, including inserter modules for replacing the missing log-likelihood ratios by means of dummy log-likelihood ratios both upstream and downstream of said first decoding module.

80. An apparatus for decoding a serial concatenated convolutional coded signal modulated by means of a two-dimensional modulation scheme, the apparatus comprising:

a cascade of a first decoding module, an interleaving module and a second decoding module; and a module for subjecting said coded signal to a log-likelihood ratio computation of the coded symbols associated with said coded signal, wherein the log-likelihood ratios out of said second decoding module are fed to said first decoding module to improve the log-likelihood ratio computation performed therein according to an iterative process, wherein the serial concatenated convolutional coded signal was generated by means of cascaded first and second convolutional coding steps, wherein said first coding step generates a first convolutional coded signal to be transmitted with a required code rate and further includes at least one of:

a rate-matching step implemented by subjecting said respective convolutional coded signal to puncturing to determine what symbols of said first convolutional coded signal are to be transmitted in order to match said required code rate, and an interleaving step of said first convolutional coded signal, the apparatus further comprising at least one of a respective rate-matching module and a respective interleaver for subjecting said log-likelihood ratios to at least one of a rate-matching function and an interleaving function matching said at least one of a rate matching step and an interleaving step performed on said first convolutional coded signal, respectively.

81. A method of encoding an input digital signal, the method comprising the steps of:

subjecting said input signal to a cascade of a first convolutional coding step, an interleaving step and a second convolutional coding step to generate a serial concatenated convolutional coded signal; and subjecting said serial concatenated convolutional coded signal to modulation by a two-dimensional modulation scheme, wherein said two-dimensional modulation scheme is selected from the group consisting of M-PSK and M-QAM, wherein at least one of said first and second convolutional coding steps generates a respective convolutional coded signal to be transmitted with a required code rate and further including at least one rate-matching step implemented by subjecting said respective convolutional coded signal to puncturing to determine what symbols of said respective convolutional coded signal are to be transmitted in order to match said required code rate.

82. An apparatus for encoding an input digital signal, comprising:

a cascade of a first convolutional coding module, an interleaving module and a second convolutional coding module to generate a serial concatenated convolutional coded signal; and a modulation module for subjecting said serial concatenated convolutional coded signal to modulation by means of a two-dimensional modulation scheme, wherein said two-dimensional modulation scheme is selected in the group consisting of M-PSK and M-QAM, wherein at least one of said first and second convolutional coding modules generates a respective convolutional coded signal to be transmitted with a required code rate and further including at least one rate-matching module for subjecting said respective convolutional coded signal to puncturing to determine what symbols of said respective convolutional coded signal are to be transmitted in order to match said required code rate.

* * * * *

UNITED STATES PATENT AND TRADEMARK OFFICE
CERTIFICATE OF CORRECTION

PATENT NO. : 6,785,861 B2
DATED : August 31, 2004
INVENTOR(S) : Fabio Scalise et al.

It is certified that error appears in the above-identified patent and that said Letters Patent is hereby corrected as shown below:

Title page,
Item [56], References Cited, OTHER PUBLICATIONS, the following should be added:
-- Hagenauer et al., A Viterbi Algorithm with soft-decision outputs and its applications, 1989, IEEE< pg. 1680-1686. -- and
-- Bahl et al., "Optimal decoding of linear codes for minimizing symbol error rate, 3-1974, IEEE Trans. on info. Theory, pg. 284-287. --.

Signed and Sealed this

Twenty-eighth Day of December, 2004

JON W. DUDAS
*Director of the United States Patent and Trademark Office*